United States Patent [19]

Baba

[11] Patent Number: 5,290,134
[45] Date of Patent: Mar. 1, 1994

[54] PICK AND PLACE FOR AUTOMATIC TEST HANDLER

[75] Inventor: Minoru Baba, Saitama, Japan

[73] Assignee: Advantest Corporation, Tokyo, Japan

[21] Appl. No.: 801,875

[22] Filed: Dec. 3, 1991

[51] Int. Cl.⁵ .............................................. B65G 65/02
[52] U.S. Cl. ...................................... 414/404; 294/65;
294/87.1; 414/416; 414/754
[58] Field of Search ................ 414/404, 416, 627, 754,
414/786; 294/64.1, 65, 87.1

[56] References Cited

U.S. PATENT DOCUMENTS

| | | | |
|---|---|---|---|
| 3,542,224 | 11/1970 | Warren | 414/416 |
| 3,860,280 | 6/1975 | Karlsson | 294/87.1 |
| 4,222,166 | 9/1980 | Kurek et al. | 414/404 X |
| 4,264,268 | 4/1981 | Morahan | 414/754 |
| 4,376,339 | 3/1983 | Ammon et al. | 414/754 X |
| 4,423,815 | 1/1984 | Boissicat | 209/655 |
| 4,631,815 | 12/1986 | Bocchicchio et al. | 294/64.1 X |
| 4,733,462 | 3/1988 | Kawatari | 294/64.1 X |
| 4,744,595 | 5/1988 | Tonning et al. | 294/65 |
| 4,752,181 | 6/1988 | Klingler | 294/64.1 X |
| 4,832,180 | 5/1989 | Ferrero | 294/65 X |
| 4,926,118 | 5/1990 | O'Connor | 324/158 F |
| 4,958,982 | 9/1990 | Champet et al. | 414/404 X |
| 4,981,409 | 1/1991 | Hirose et al. | 414/754 X |
| 5,048,811 | 9/1991 | Hochbein | 294/64.1 |
| 5,073,079 | 12/1991 | Akagawa | 414/416 |
| 5,079,903 | 1/1992 | Hakansson | 414/416 X |
| 5,131,800 | 7/1992 | Akagawa | 414/404 X |

FOREIGN PATENT DOCUMENTS 2002947 7/1971 Fed. Rep. of Germany ........ 294/65

Primary Examiner—David A. Bucci
Attorney, Agent, or Firm—Knobbe, Martens, Olson & Bear

[57] ABSTRACT

A pick and plate apparatus for use in an automatic test handler picks up electronic devices from one type of tray, transfer the electronic devices in a horizontal plane to another type of tray, and places the electronic devices in a predetermined position on the other tray for testing and sorting. The pick and place apparatus includes a plurality of suction inlets for picking up the electronic devices from the tray with suction power caused by a vacuum, a guide frame for slidably mounting the plurality of suction inlets in a horizontal direction, a mechanism for providing up-and-down movement to the suction inlets for picking up the electronic devices from the one tray and placing the device in the other tray, and a mechanism for adjusting the spacing of the suction inlets to compensate for the differences in spacing between one tray and another tray.

6 Claims, 13 Drawing Sheets

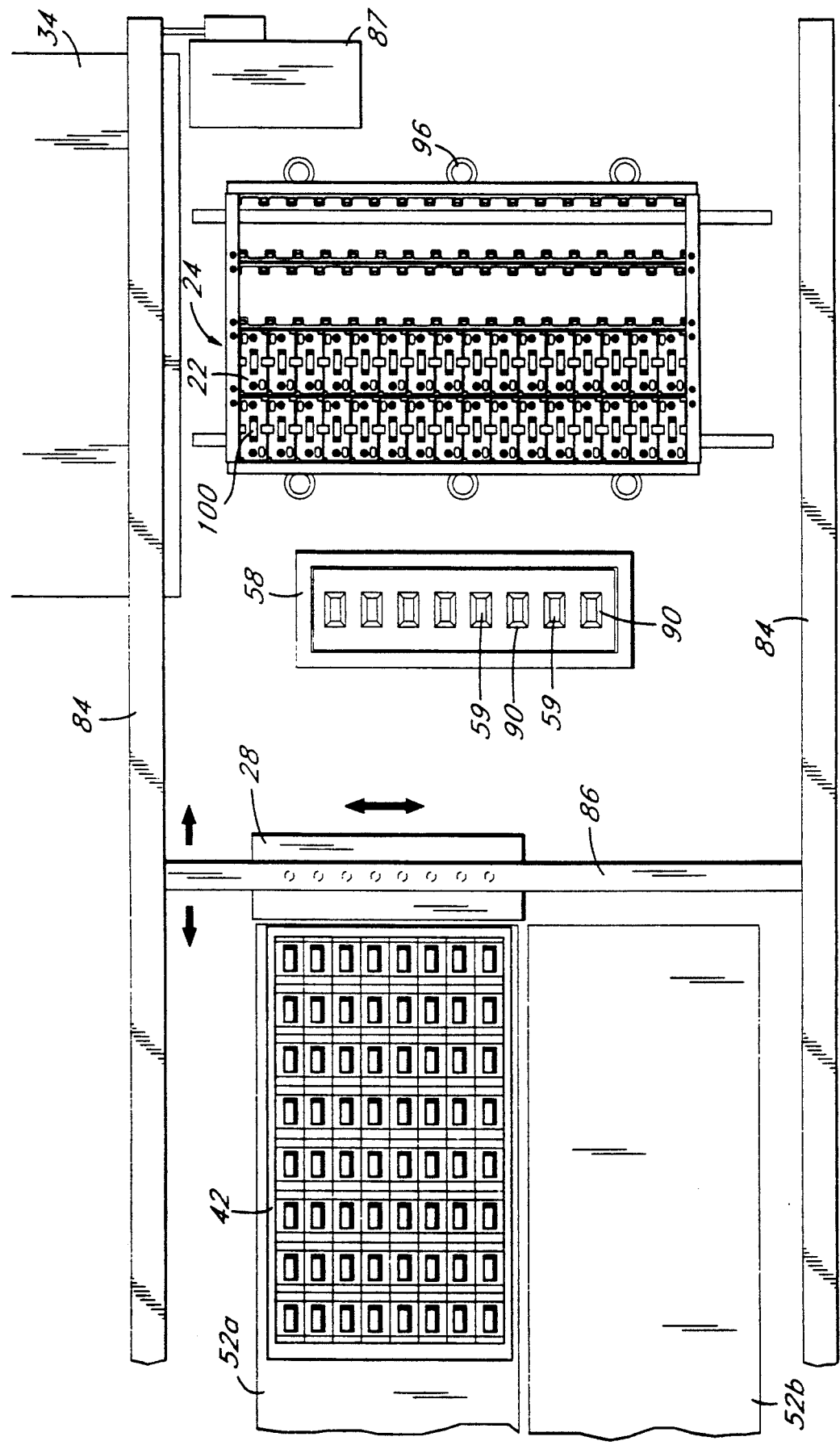

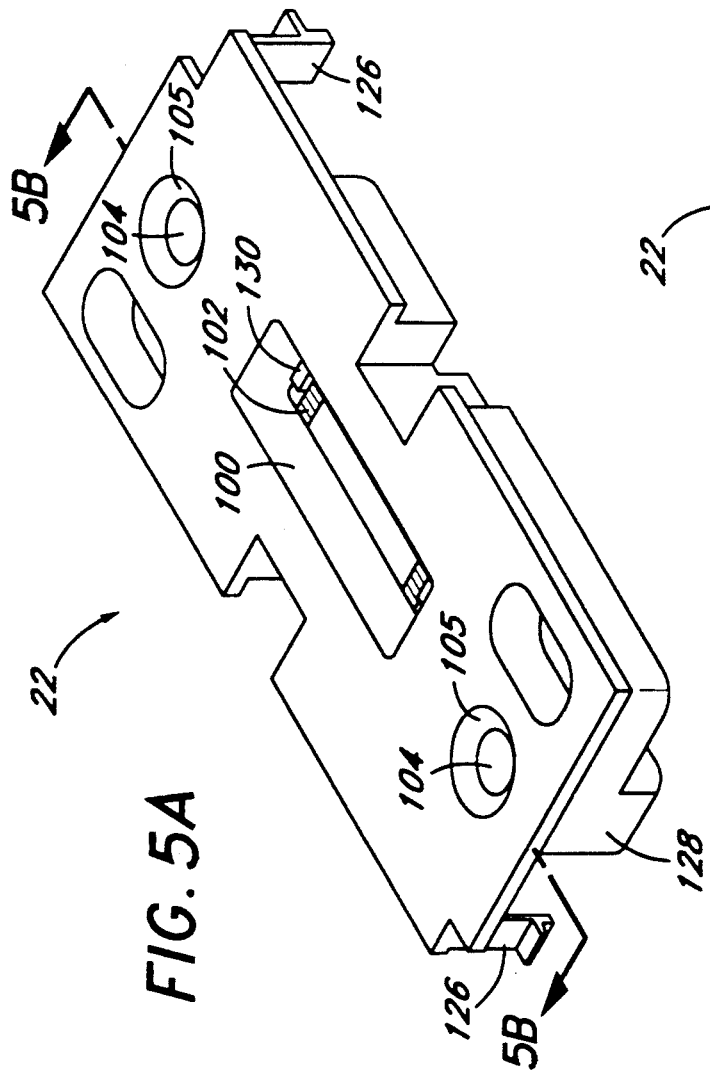
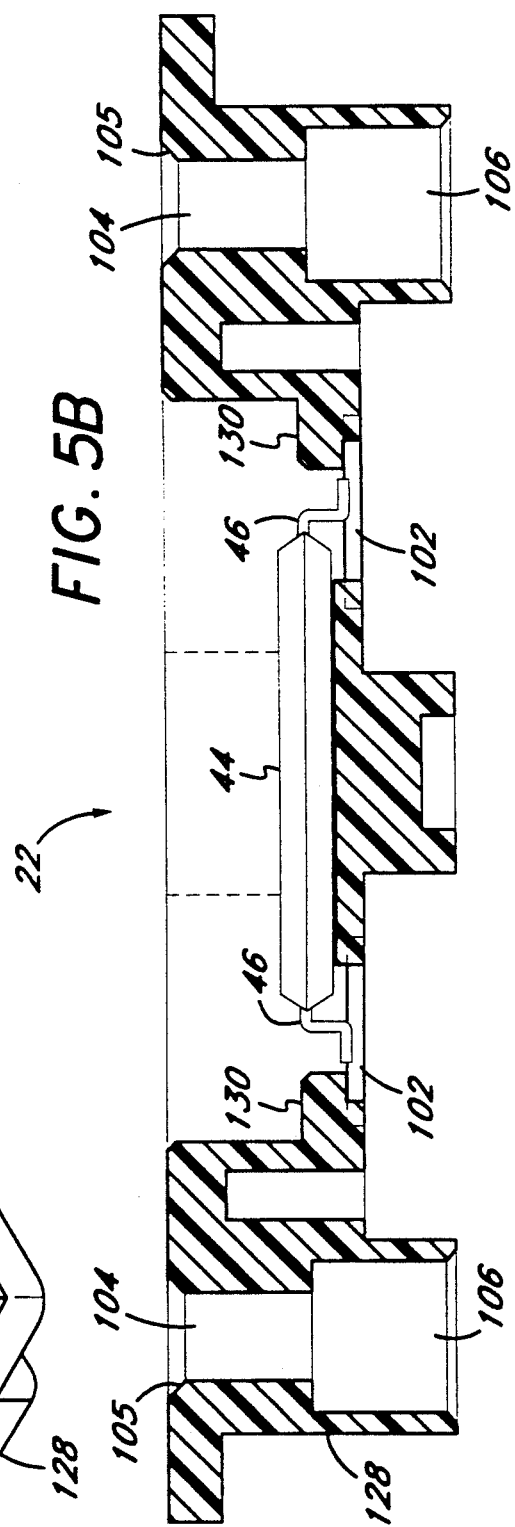

PICK AND PLACE FOR AUTOMATIC TEST HANDLER

FIELD OF THE INVENTION

This invention relates to a pick and place apparatus for small articles, and more particularly, to a pick and place apparatus for use in an electronic device automatic test handler. The pick and place picks up electronic devices from a tray, transfers them along a horizontal plane and places them in another tray, while simultaneously adjusting a spacing difference between the devices in the two trays.

BACKGROUND OF THE INVENTION

Modern electronics devices, such as integrated circuits ("ICs") or semiconductor "chips" are rapidly increasing in production quantity and functionality, while decreasing in size and unit cost. For increasing productivity of the electronic devices, it is required to decrease test cost and test time. This can best be accomplished with fully automated electronic device test systems.

In a conventional test system, electronic devices to be tested are removed from their container, usually called a "magazine," and separated from one another by the force of gravity. That is, the electronic device to be tested is positioned initially at a vertically higher position than the test head and, by its own weight, is separated from the other devices such that it slidably descends to the test head. After the test, the electronic device descends further, due to gravity, to a lower position than the test head so as to be sorted depending on the test results.

Such conventional device test systems, which utilize the force of gravity to separate and transfer the electronic devices, have two inherent disadvantages. First, since modern electronic devices have become smaller and lighter than before, an individual electronic device does not have sufficient weight to efficiently separate from the others. This causes "jamming," wherein two or more electronic devices stick together and cannot separate from one another. If such jamming occurs, it is usually necessary to stop the operation of the test system to clear the jam, thus causing a serious loss of time and efficiency. Furthermore, the risk of jamming is greatly increased due to the configuration of the new types of electronic devices to be tested. For example, one new type of electronic device has electric leads (pins), not only on two sides of the chip package (as in the conventional dual-in-line or "DIP" package), but on all sides of the package.

Second, to avoid further jamming, the outer surface of the electronic device must be made sufficiently smooth so as to not cause any friction or unwanted engagement with other devices. However, this is also impractical since the plastic molded packages of the devices inevitably have some burrs remaining from the production process. It is not economically practical to completely eliminate such burrs. Therefore, the electronic device test systems which rely on the force of gravity for device separation and transfer suffer from a few serious disadvantages in view of modern techniques in electronic device packaging.

Therefore, there is a new type of test handler which intends to overcome such disadvantages inherent to conventional types of test handlers. The improved test handler increases manufacturing productivity of such electronic devices, and thereby reduces their unit cost, by increasing the test speed by testing a plurality of the devices at the same time.

The new type of automatic test handler places a number of electronic devices to be tested on a test tray and positions them so as to be engaged by a test head plate having a number of corresponding test contactors. One device is placed on a seat of a carrier module, and each carrier module is provided with one or two device seats. A number of modules are then arrayed by column and row in a test tray. The test tray having a number of carrier modules is arranged so as to be in vertical alignment (either above or below) with a test fixture. The test fixture includes test contactors (test pins) for contact with pins of the device to be tested for supplying test signals and receiving the response signals from the device. Each module is aligned with a corresponding test contactor so that when either the test tray or the test fixture are moved vertically toward another, the contactor engages the electronic device positioned within the carrier module.

The contactor is provided with a number of test pins or electric leads which come into electrical communication with the leads of the electronic devices to be tested. The automatic test handler is electrically connected to a electronic device test system, for example, an IC tester which includes a test signal generator for supplying a test signal to the device, and with a signal comparator for analyzing the results of the test. Based on such results, the electronic devices are transferred to another location in the test process and sorted for proper handling.

Even in such an automatic tester, there is a need to take out electronic devices to be tested from a container and place the devices in an appropriate position on the test tray before the test. It is also necessary, after the test, to take out the tested devices from the test tray and sort them, based on the test results, into containers for shipping. Because of the recent demands in the electronics industry, as stated above, various new devices having new types of packaging have been developed. Containers for such new devices are also changing. One of the examples of such a container is called "a customer tray" wherein a number of devices are aligned in a horizontal plane, similar to the test tray as described above.

However, the customer trays are different in size, shape, capacity and spacing between the seats of the devices from manufacturer to manufacturer. The spacing in the customer tray is also different from the spacing in the test tray since the test tray requires more accuracy for securing the perfect contact with the test contactor and the device leads. Therefore, it is also necessary in the new type of test handler to equip a pick and place apparatus with the capability to adjust distances between the devices to overcome the differences in the spacing of the devices in the customer trays.

Thus, there is a need in the electronic device test industry for a pick and place which can pick the devices and place them in the test tray, while adjusting a space difference between the devices in the trays, and subsequently pick up the tested devices and sort them in accordance with the test result into the customer trays for shipping.

SUMMARY OF THE INVENTION

The pick and place of the present invention utilizes a plurality of suction inlets to efficiently and accurately pick up electronic devices along a horizontal plane and place them in a predetermined position, thus eliminating the disadvantageous use of gravity as a transfer mechanism. The pick and place picks up the electronic devices to be tested from a customer tray with a suction force caused by a vacuum, transfers the electronic devices and releases them in each seat of a plurality of carrier modules aligned in row and column on the test tray. Conversely, the pick and place of the present invention picks up the electronic devices already tested from the test tray with a suction force at the suction inlets, sorts them into categories in accordance with the test results to different customer trays and places them into each seat of the customer tray for shipping.

The pick and place of the present invention adjusts the spacing of the suction inlets to compensate for spacing differences between the customer tray and the test tray and accurately removes the electronic devices from one tray to precisely place them in predetermined positions in the other tray. The pick and place of the present invention can easily adapt to the different kinds of customer trays by changing an adjustment clip depending on the spacing of the customer tray. This adjustment of the spacing is accomplished by a relatively simple arrangement using a drive source and a pantograph means which amplifies the movement of the drive source.

The pick and place of the present invention can correct the inaccuracies of spacing and alignment of the electronic devices in the customer tray by utilizing a precisor. The spacing and alignment of the electronic devices in the seats of the customer tray are not accurate enough to allow direct transfer and placement of the devices in the test tray. The pick and place of the present invention first picks up the devices and transfers them to the precisor and then drop them therein. The precisor of the present invention includes a plurality of relatively large receptacles, the inner sides of which are tapered. At the bottom of each receptacle is a seat accurately structured for aligning the posture of the device. The spacing of the bottom seats is also precisely regulated to mirror the spacing of the test tray. Therefore, once the electronic devices are dropped in the precisor, the spacing between the devices and the alignment posture (direction, etc.) of the devices are accurately corrected. The pick and place again picks up the electronic devices from the bottom seat of the precisor and places them on the predetermined seat of the carrier module on the test tray.

The pick and place of the present invention is adapted to be incorporated into a new type of automatic test handler such that the customer tray is mounted in a horizontal manner for electronic device removal. Preferably, a plurality of the devices are removed simultaneously. For example, in the preferred embodiment of the present invention, the pick and place for transferring the device from the customer tray to the test tray has eight (8) suction inlets so as to pick and place eight devices at the same time. However, the devices can be removed at any rate, such as one by one, or four by four, all at once, or any other manner desired.

The customer tray is preferably mounted in the test handler such that the seats on which the electronic devices rest are in the same horizontal plane as the seats of the test tray which the electronic devices are to be transferred. The pick and place of the present invention can transfer to any x-y coordinate positions within a horizontal plane by utilizing step motors and encoders as is known in a x-y plotter technology or in a robot technology. The pick and place of the present invention preferably includes a pair of guides for each suction inlet to adjust the position with the carrier module when placing the electronic device in the seat of the carrier module.

This horizontal, coplanar arrangement permits the transfer of electronic devices to be very accurately and precisely controlled, which is virtually impossible to do with gravity powered transfer mechanisms. In other words, the weight, whether it be small or great, and the momentum of the falling device, both of which frequently lead to jamming, are not problematic factors under the present configuration.

The pick and place of the present invention comprises a housing, a plurality of suction inlets for picking up electronic devices with a vacuum, a guide for horizontally guiding the suction inlets and a space adjusting mechanism for compensating for the spacing differences between the customer tray and the test tray. The suction inlets are supported on a plurality of upper supports and lower supports and aligned alternatively and symmetrically with respect to the guide in a horizontal plane. The upper supports slidably move along the guide while the lower supports move vertically on the upper supports. The space adjusting means includes a variable stopper for adjusting variance of the spacing in the customer trays and a pantograph mechanism driven by an air cylinder. Since the pantograph mechanism amplifies a small movement of the air cylinder, relatively large difference in the spacing between the test tray and the customer tray can be adjusted. An adjustor clip is provided in the variable stopper means for interchangeably adjust the spacing difference between the kinds of the customer trays.

Thus, the pick and place apparatus of the present invention overcomes the problems associated with gravity-fed, conventional automatic test handlers or horizontal transfer type conventional test handlers of the prior art by providing precise pick and place movement along a horizontal plane while providing for adjustment and correction of the device spacings while loading the electronic devices from one type of tray to the other type of tray.

BRIEF DESCRIPTION OF THE DRAWINGS

FIG. 4 is a plan view of the test handler of FIG. 1 showing a positional relationship between the customer tray, the precisor, test tray and the pick and place of the present invention.

FIG. 5A is a perspective view of one example of a carrier module of the present invention including a seat and slits for the leads of the device.

FIG. 5B is a cross sectional view of the carrier module along the line 5B—5B of FIG. 5A including an electronic device to be tested in the seat of the carrier module.

FIGS. 13A and 13B also show an operational principle of varying the spacing of the suction inlets by the variable stopper in FIGS. 11 and 12 depending on the kinds of the customer trays.

DETAILED DESCRIPTION OF THE INVENTION

Figure 1:
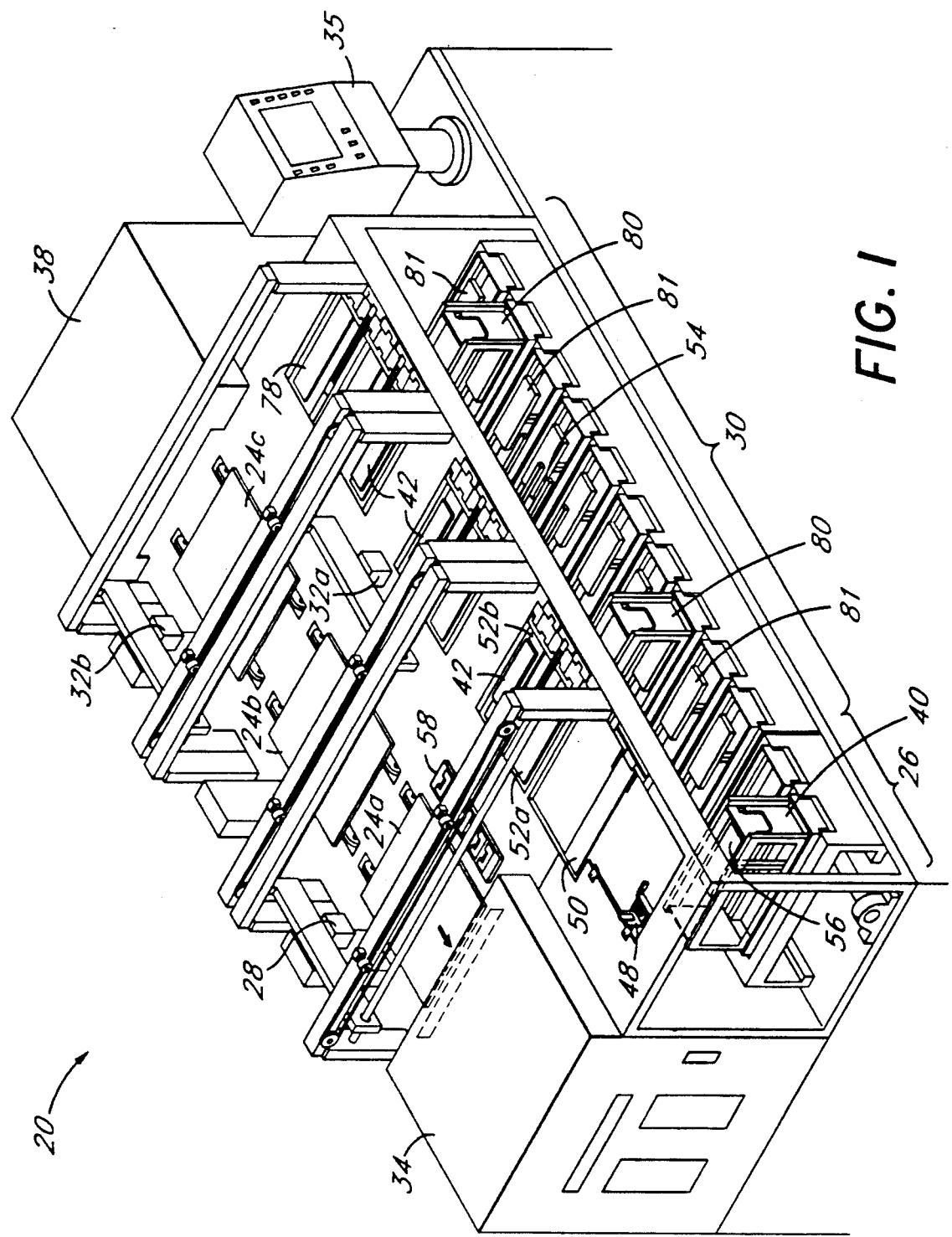
FIG. 1 is a perspective view of an automatic test handler which includes a load pick and place, a sorting pick and place and a precisor in accordance with the present invention.

To facilitate a better understanding of the present invention, the description will be given regarding a new automatic test handler wherein the present invention will be employed, however, it should be understood that a pick and place of the present invention may be employed in a wide variety of automatic test handler. FIG. 1 illustrates generally an automatic test handler 20 utilizing a contact assembly and test trays in accordance with the present invention. A rear view of the test handler of FIG. 1 is illustrated in FIG. 2.

Automatic Test Handler

Figure 6:
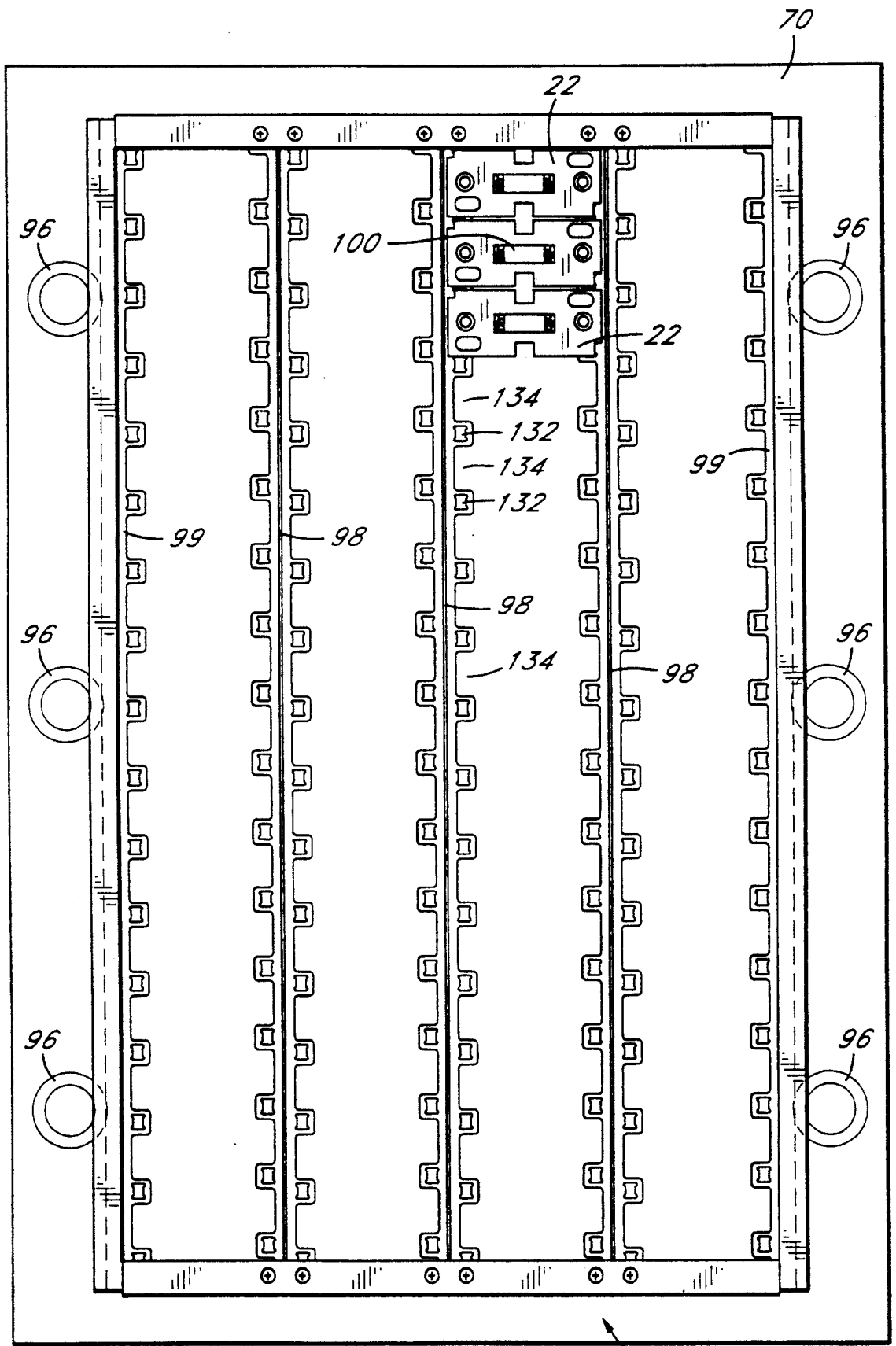
FIG. 6 is a plan view of an example of the test tray including the carrier modules of FIGS. 5A and 5B.

Some electronic devices, for example, the newest type of IC memory chips, are packed in trays ("customer trays") by manufacturers of the devices and for sale in the market. The shape and size of the customer trays vary from manufacturer to manufacturer. In the test handler 20 of FIG. 1, the electronic devices to be tested are first transferred from the customer tray to carrier modules within a test tray to facilitate operation of the test handler 20. A typical carrier module and test tray are shown in FIGS. 5 and 6 and will be described in more detail below. Essentially, a number of test trays containing electronic devices are processed through the test handler 20 of FIG. 1 in a stage-by-stage manner in order to test the electronic devices for defects. The focus of the present invention is in the test head stage where the contact assembly is located.

Figure 2:
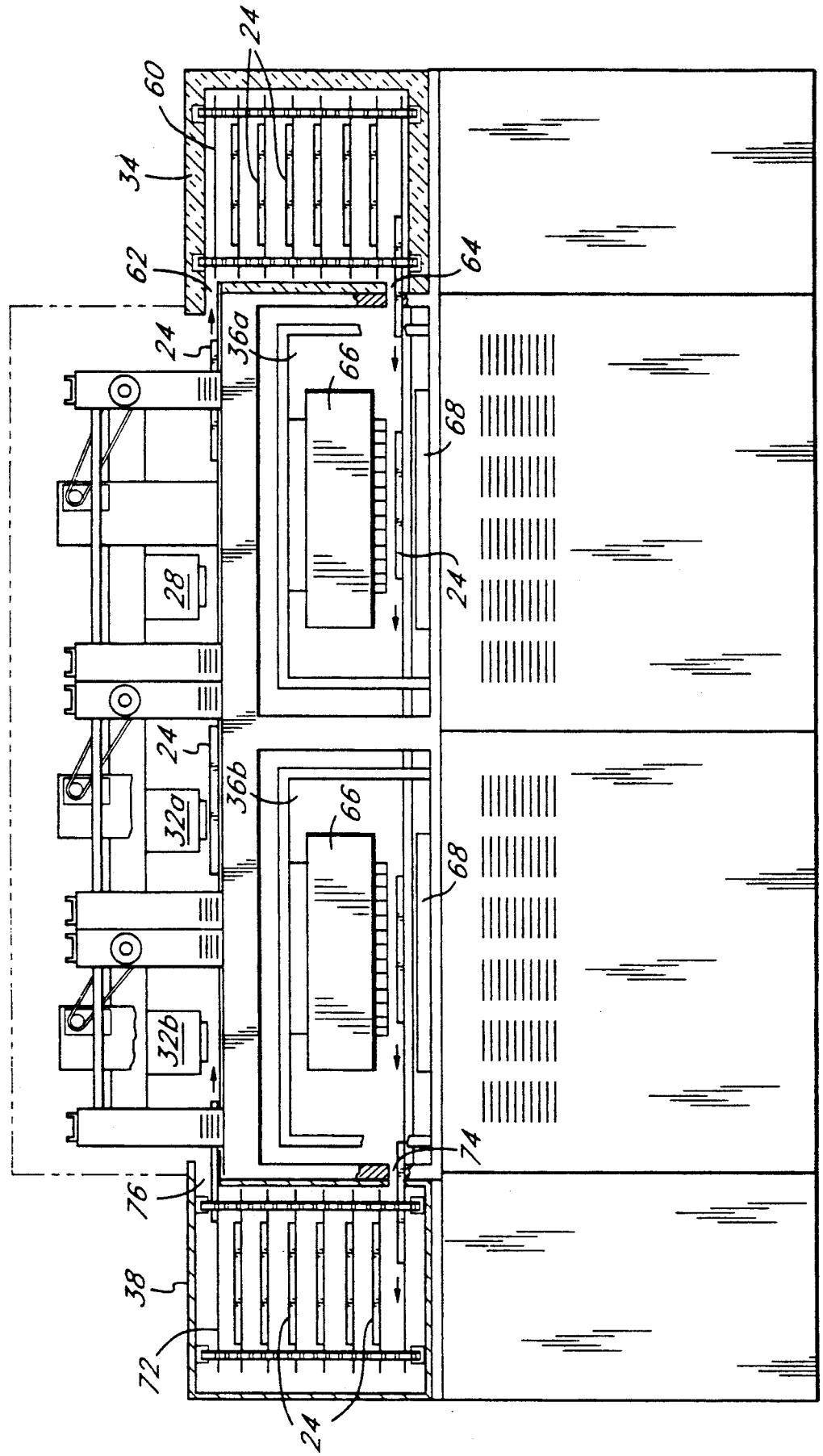
FIG. 2 is a rear view of the automatic test handler of FIG. 1 illustrating a soak chamber, an unsoak chamber and two test heads.

The electronic device test system of FIGS. 1 and 2 is comprised of a loader 26, a load pick and place 28, an unloader 30, a soak chamber 34, test heads 36a and 36b, an unsoak chamber 38 and two sort pick and place devices 32a,b. The test handler 20 of FIG. 1 also includes an operator console 35, a control module and an electronic module (not shown) for interfacing with a test system, for example an IC tester.

Figure 3:
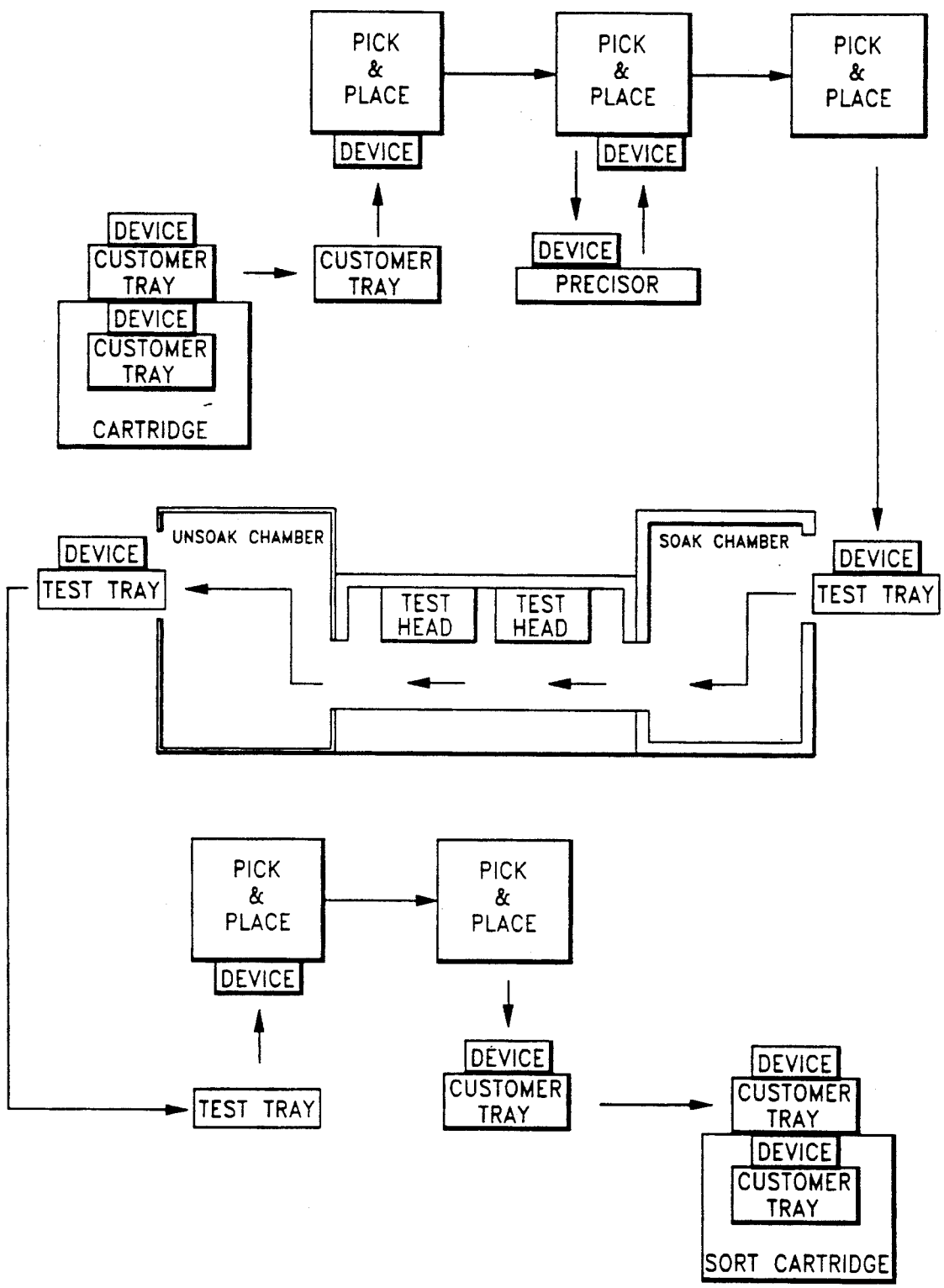
FIG. 3 is a flow diagram for explaining a total test process of an electronic device in accordance with the automatic test handler of FIGS. 1 and 2.

FIG. 3 summarizes the overall procedure of testing the IC devices in accordance with the automatic test handler 20 of FIG. 1, and is a useful reference in connection primarily with FIG. 1, for the following description.

The loader 26 is comprised of one or more customer tray magazines 40, a loader catcher 48, a buffer 50, loader stages 52a, 52b, and a transfer arm 54. A customer tray 42 is a tray carrying a plurality of IC devices on it for delivery of the IC devices to a user of the IC devices. The customer tray 42 differs in its shape, size, and number of IC devices to be carried from IC manufacturer to manufacturer. The customer trays 42 with IC devices to be tested are installed in the customer tray magazines 40, the maximum number of which is typically twenty-four trays for each magazine.

Loader elevator 56 positioned underneath of the customer tray magazines 40a and 40b (not shown but next to 40a), push the customer trays 42 to the top of the customer tray magazines one by one. The loader catcher 48 descends and picks up the top customer tray 42. The loader catcher 48 goes up to the original position and then moves horizontally until a position right over the buffer 50. The customer tray is unloaded from the loader catcher 48 to the buffer 50. The loader catcher 48 goes back to the original position to catch the next customer tray.

The transfer arm 54 shown in the middle of FIG. 1 can move in both horizontal and vertical directions. The transfer arm 54 receives the customer tray 42 on the buffer 50 and transfers the customer trays 42 to a loader stage 52. Thus, as illustrated in FIG. 1, the customer tray 42 is set on the loader stage 52b. In the actual system, preferably, two customer trays 42 are respectively set on the loader stages 52a and 52b to be ready for the next sequence of the test handler 20.

The load pick and place 28 can move freely in a horizontal plane upon sensing the positions of the electronic devices, the customer trays 42, and a test tray 24. The load pick and place 28 picks one or more of the electronic devices to be tested from the customer trays 42a and 42b and transfers the devices to the test tray 24a. For example, the load pick and place 28 has eight vacuum heads or suction inlets which pick the devices up using a compressed air.

The IC devices 44 (shown in FIG. 5B) are transferred from the customer tray to the test tray because the automatic test handler 20 requires more accurate and precise positioning of the devices to ensure sufficient contact between the device leads and the contactors of the test heads 36a and 36b. Since the primary purpose of the customer tray is to provide the electronic devices to customers in a packed form, the layout of device holding seats are not necessarily accurate. Therefore, preferably, the load pick and place 28 stops over a precisor 58 and drops the electronic devices thus brought from the customer tray 42 into seats 59 on the precisor 58, and then picks up the devices again. The purpose of the precisor 58 is to align and correct the spacing of the electronic devices picked up from the customer trays. The emptied customer trays are transferred to the stages of the unloader 30 for receiving the tested devices depending on the test result.

The test trays 24 includes a plurality of carrier modules 22 (FIGS. 5A and 5B) precisely aligned but still flexibly movable on the frame of the tray, the details of which will be described with respect to FIGS. 5 and 6. Each carrier module 22 is loaded with the electronic device to be tested in a seat by means of the load pick and place 28 as described above. The test trays 24 thus filled with the devices are transferred to the soak chamber 34. As illustrated in the right hand side of FIG. 2 (which is a rear view of the test handler 20 shown in FIG. 1), at the direction of the control module, the test tray 24 is loaded on a top part of a chamber elevator 60 of the soak chamber 34 through a passageway 62.

The test trays are timely and orderly conveyed by the chamber elevator 60 through the soak chamber 34 in which the ambient temperature is selectively elevated above or lowered below the temperature external to the test system to such a degree that, at the conclusion of the passage of the test trays through this chamber, the electronic devices are at a desired testing temperature. At the conclusion of the soak stage, each tray of electronic devices is transferred through a passageway 64 into the test heads 36a and 36b, the environment of the test heads being suitable to maintain the devices at their desired testing temperature.

The test heads 36a and 36b respectively comprise a vertical drive 66 for driving the test tray 24 downward and a test fixture 68 for providing a test signal to the electronic devices and receiving the resulted signal through test contactors (FIG. 4). The devices 44 are energized, stimulated, and their responses are monitored for test purposes by an IC tester (not shown) which communicates with the devices 44 via the test fixture 68.

At the conclusion of the test, each set of electrical devices is transferred from the test heads 36a and 36b to a chamber elevator 72 at the bottom of the unsoak chamber 38 through a passageway 74. Each of the test trays is gradually conveyed through the unsoak stage via the chamber elevator 72. During this time, they are exposed to an environment in which heat is transferred from or to the devices to the extent that, at the conclusion of this stage, the temperature of said devices is at or near equilibrium with the environment external to the test system.

The test trays 24 are then removed from the unsoak chamber 38 through passageway 76 and placed on the predetermined position on the test handler 20 as shown in FIG. 2. In the example of FIG. 1, two test trays 24b and 24c carrying the tested electronic devices are positioned on the floor of the test handler 20 to be accessed by two sorting pick and place devices 32a and 32b. The sorting pick and place devices 32a and 32b pick up the tested devices and place the devices in the seats of the customer trays 42 on unloader stages 78 depending on the test results. The unloader 30 is comprised of the unloader stages 78, the transfer arm 54 and customer tray sort magazines 80 having elevators 81 therein. Although only two sort magazines 80 are shown in FIG. 1 for the unloader 30, in the actual system, all sorting positions are set with the sort magazines 80 to receive the customer trays 42. The electronic devices are thus classified based on the test results and set in the appropriate customer trays.

Although each of these principal components of the present invention are described in more detail below, several components are also the subject of copending and commonly owned patent applications which are hereby incorporated by reference. For example, the system configuration and method of the automatic test handler is subject to the patent application titled APPARATUS AND METHOD FOR AUTOMATIC TEST HANDLING, Ser. No. 803,159, filed Dec. 4, 1991 and the loader/unloader system is subject to the patent application titled LOADER AND UNLOADER FOR TEST HANDLER, Ser. No. 803,154, filed Dec. 4, 1991. Furthermore, the structure and process in the contact assembly are the subject of an application titled CONTACT ASSEMBLY FOR AUTOMATIC TEST HANDLER, Ser. No. 801,056 filed. Dec. 3, 1991, now U.S. Pat. No. 5,227,717.

Pick and Place for Test Handler

The foregoing is a simplified overall procedure of operation of the automatic test handler of FIG. 1. The present invention focuses on the load pick and place 28 and the sorting pick and place 32 preferably used in the test handler as shown in FIGS. 1 and 2.

FIG. 4 is a plan view showing the positional relationship between the customer tray, the precisor, test tray and the pick and place of the present invention. The customer trays 42, the precisor 58 and the test tray 24 are aligned substantially on the same horizontal plane of the automatic test handler 20 of FIG. 1. The load pick and place 28 in FIG. 4 is used for picking electronic devices from the customer tray and transferring them in a horizontal plane and placing them in the predetermined seats of the test tray. The sorting pick and place 32 in FIGS. 1 and 2 is used in the opposite way to the load pick and place 28, i.e., for sorting the tested devices by picking the devices from the test tray and placing them in the customer tray depending on the test result of each device. However, the mechanical structure and the operational principles of the sorting pick and place 32 are identical to the load pick and place 28, thus, the description will be made mainly regarding the load pick and place 28.

In FIG. 4, the pick and place 28 is attached under a beam 86. As will be explained later with respect to FIG. 7, the pick and place is movable along the beam 86 by means of a drive force comprises, for example, a step motor 87. Both ends of the beam 86 are engaged with side beams 84. Similarly, the side beam 84 is provided with a drive force, preferably structured by a step motor which is independent of the one in the beam 86 so that the beam 86 can move along the side beams 84. The pick and place of the present invention includes a sensor for identifying an origin of the x-y coordinate in the horizontal plane as is known in the art. Therefore, the pick and place 28 can move freely in the horizontal plane, by electrical control signals for controlling the step motors from the control module in the test handler, the technology of which is well known in the art such as used, for example, in a x-y plotter or in a robot technology.

The load pick and place 28 picks one or more of the electronic devices to be tested from the customer trays 42 and transfers the devices to the test tray 24. For example, the load pick and place 28 has eight suction inlets which pick the devices up using suction force caused by a vacuum. However, the devices can be removed at any rate, such as one by one, or four by four, all at once, or any other manner desired. In the preferred embodiment of the present invention, the load pick and place 28 utilizes eight suction inlets while the sorting pick and place 32 utilizes four suction inlets.

The IC devices 44 are transferred from the customer tray to the test tray because the automatic test handler 20 requires more accurate and precise positioning of the devices to ensure sufficient contact between the device leads and the contactors of the test heads 36a,b. Further, the test tray usually needs a wider spacing than that of the customer tray since the test tray accommodates carrier modules for seating the corresponding IC devices, again to ensure sufficient contact between the device leads and the contactors. Since the primary purpose of the customer tray is to provide the electronic devices to customers in a packed form, the layout of device holding seats are not necessarily accurate. Although the test tray 24 in FIG. 4 is not filled with the carrier module for convenience of showing the structure of the test tray and carrier module, the actual test tray will be filled with the carrier module for maximizing the test efficiency.

Therefore, one of the features of the load pick and place 28 or sorting pick and place 32 in accordance with the present invention is that the pick and place is capable of adjusting the spacing of the suction inlets so as to overcome the spacing differences between the customer tray and the test tray, which features will be described in more detail later. Further, for improving the positional accuracy in loading the IC devices in the test, the precisor 58 is preferably arranged between the customer trays 42 and the test tray 24. In this arrangement, the load pick and place 28 stops over a precisor 58 and drops the electronic devices thus brought from the customer tray 42 into seats 59 on the precisor 58 and picks up the devices again.

The precisor 58 of the present invention includes a plurality of receptacles each of whose sides create a relatively large tapered portion 90. At the bottom of each receptacle of the precisor a seat 59 is accurately structured for limiting the posture of the device. The spacing between the bottom seats 59 is also precisely structured to fit with the spacing of the seats of the carrier modules 22 on the test tray 24. Therefore, once the electronic devices 44 are dropped in the precisor 58, the spacing between the devices and the posture (direction, etc.) of the devices 44 is corrected and thus precisely match with seats 100 of the carrier module 22. The load pick and place 28 again picks up the electronic devices from the bottom seats 59 of the precisor 58 and places them on the predetermined seat 100 of the carrier module 22 on the test tray 24.

FIG. 5A shows a perspective view of an example of a carrier module 22 for placing an IC device in its seat for testing the device with the aid of the pick and place of the present invention. The carrier module 22 is made, for example, by a plastic molding process and is formed in symmetrical manner with respect to the center. The carrier module includes the seat 100 as also shown in FIG. 5 at the center of the body, upper guide holes 104 having tapered inlets 105, slits 102, lower guide holes 106, stopper nails 126 and aligning ends 128.

In this example, in each seat 100 of the carrier module 22, an IC device to be tested is seated with its electric leads 46 on the floor of the seat. On the floor of the seat 100, there is provided a plurality of slits 102 corresponding to the leads 46 of the device 44 so that the test contactor (not shown) in the test fixture 68 can enter therethrough to contact with the device leads. Also, portions of the leads 46 are inserted in the slits 102. In the seat of the carrier module 22, a pair of steps 130 are preferably provided for determining the position of IC device 44 to be tested when the IC devices 44 are dropped by the load pick and place 28 from the customer tray to the test tray 24 as described above.

FIG. 5B is a cross sectional view of the carrier module of the FIG. 5A taken along the line 5B—5B including an IC device to be tested. The IC package in FIG. 5B is one of the newest types of IC packages and is called a TSOP (Thin Small Outline Package). The characteristics of the TSOP are that it has electric leads at the longitudinal ends of the package, the overall height is under 1.27 millimeter, the spacing between the leads is under 0.8 millimeter and the lead width is under 0.4 millimeter. Because the lead spacing and the lead width are very small, the slits 102 are provided in the carrier module 22 for securing the electrical separation among the leads 46.

FIG. 6 is a plan view of one of the examples of the test tray 24 and the tray guide 70 in accordance with the present invention. The test tray 24 is guided by the tray guide 70 to maintain a horizontal plane. The tray guide 70 includes a plurality of rotors 96 which engage with indents on both side frames 99 of the test tray 24. Thus the test tray 24 is planarly supported by the rotors 96 and, at the beginning and the ending of the testing of the devices, transferred to the next stage of the test handler by rotation of the rotors 96.

Although only three carrier modules 22 are assembled on the test tray 24 as a convenience of explanation, in an actual device a full number of carrier modules, for example sixty-four, are installed on the test tray 24. The test tray 24 has frames 98 and side frames 99 both of which have windows 132 wherein the stopper nails 126 of the carrier module 22 as seen in FIG. 5A are inserted. The adjacent windows 132 on the frames constitute indents 134 wherein the aligning ends 128 of the carrier module shown in FIG. 5A are engaged. Since the stopper nail 126 is flexible because it is thin and is made of plastic materials, it is easily inserted in the window 132.

Figure 9:
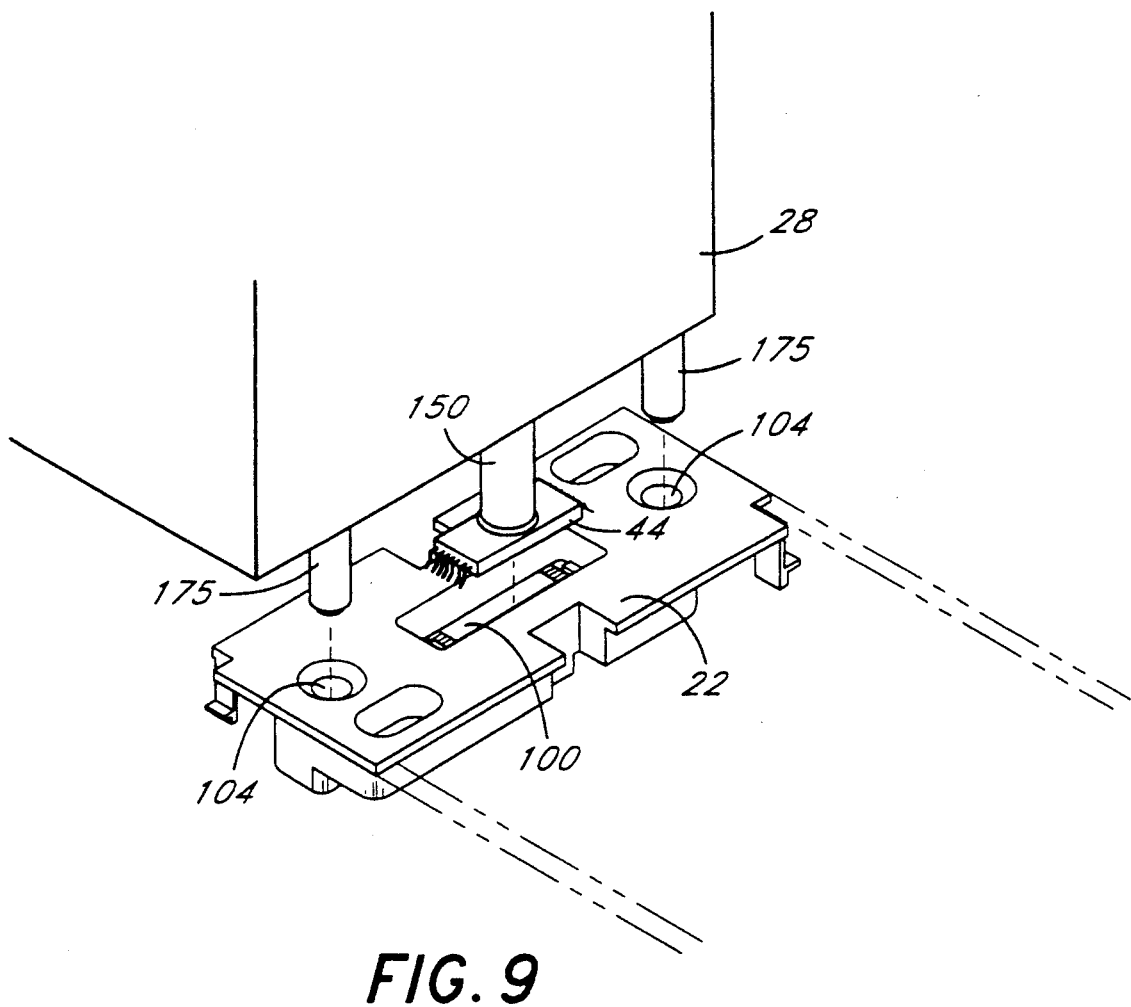
FIG. 9 is a perspective view of the pick and place of the present invention for showing the positioning for placing the electronic devices in the seat of the carrier module on the test tray.

Once the stopper nail 126 is inserted in the window 132, it works as a stopper preventing the carrier module 22 from going upward over the predetermined distance. Thus, the carrier module 22 can significantly move in upward direction (floating) over the test tray 24 until it is restricted by the stopper nails 126. The carrier module 22 also can flexibly move in a horizontal plane on the test tray 24 because the indent 134 is designed wider than the aligning ends of the carrier module 22 and there is a small gap therebetween. The reason for having floating capability in both vertical and horizontal direction in the assembly of the carrier module on the test tray 24 is to secure flexibility for positioning with a guide of the pick and place when the pick and place 28 places the electronic device in the seat of the carrier module as shown in FIG. 9. The floating of the carrier module is also important to ensure a smooth positioning when the carrier module contacts with the test contactors in the test fixture 68 of FIG. 2.

Figure 7:
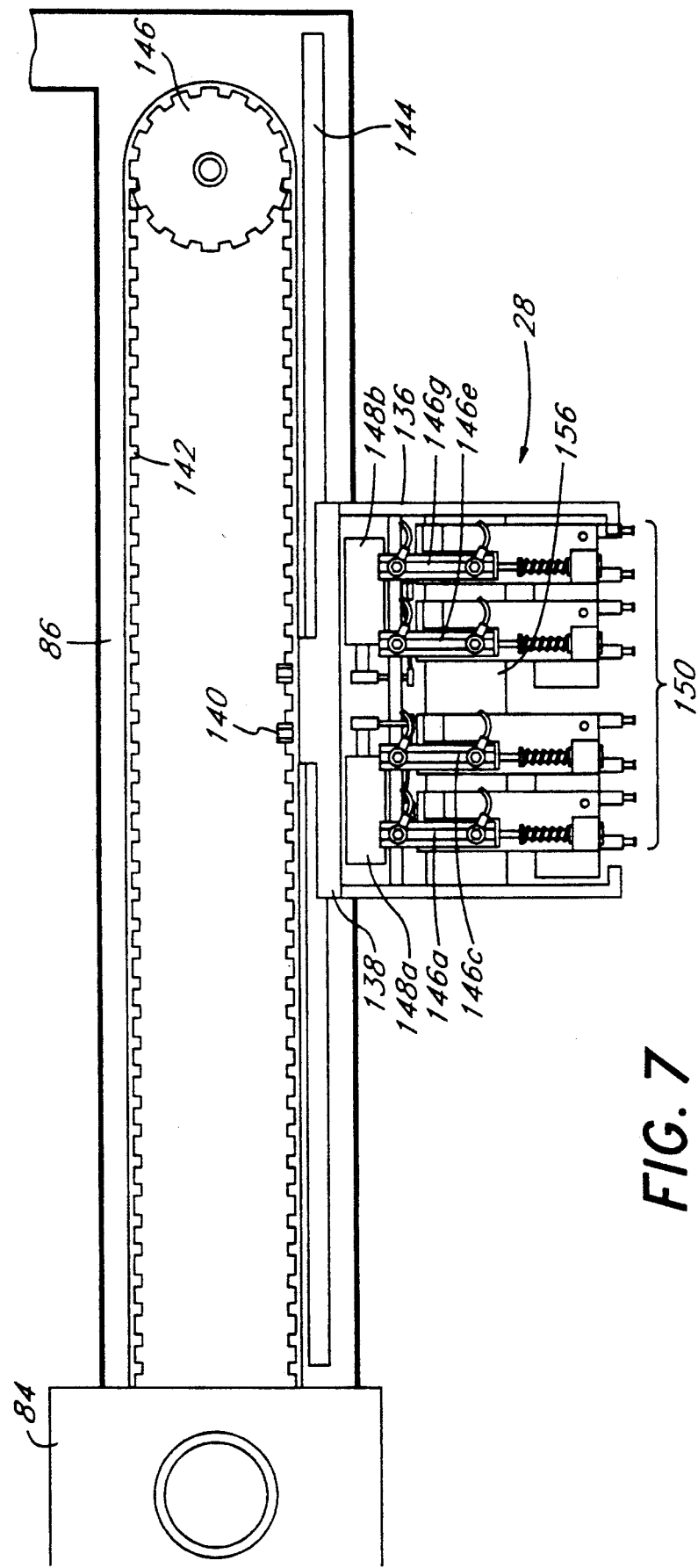
FIG. 7 is an abbreviated front view of a preferred embodiment of the pick and place in accordance with the present invention.

FIG. 7 is a front view of the pick and place of the present invention. The pick and place 28 is attached to the beam 86 by means of a guide 144 and a belt 142. A holder 138 at the top of a housing 136 of the pick and place 28 is connected to the belt 142 by a connector 140.

The belt 142 is horizontally movable by the rotation of a pulley 146. Thus, the pick and place 28 translates laterally in the horizontal plane along the guide 144. As described with respect to FIG. 4, the beam 86 moves back and force longitudinally in a horizontal plane along the beam 84 by a means (not shown) similar to the pulley 146 and the belt 142. Therefore, the pick and place 28 can freely translate within a horizontal plane in a manner similar to an x-y plotter, as is well known in the electronics or mechanical industry.

The pick and place 28 comprises the housing 136, a guide 156, a plurality of suction inlets and a space adjusting mechanism. In the example of FIG. 7, the pick and place 28 includes eight suction inlets 150 so that a maximum of eight devices can be transferred between the customer tray and the test tray at the same time. However, it should be understood that any other arrangements may be employed based on the features of the present invention. An air cylinder 146 (represented by numerals 146a-146g in FIG. 7) is provided for each suction inlet 150 for driving the suction inlet up and down to descend proximate to, and raise, the IC devices.

The eight suction inlets 150 are alternately and symmetrically assembled to the guide 156. Also, the suction inlets 150 are so attached to the guide 156 that they can slidably movable along with the guide 156 by means of the space adjusting mechanism for adjusting the spacing therebetween. The space adjusting mechanism comprises an air cylinder 149 (represented by numerals 148a and 148b in FIG. 7), a pantograph and a variable stopper (shown in FIG. 11). A more detailed description regarding the structure of suction inlets and the space adjusting mechanism will be made with reference to FIGS. 8-13.

Figure 8A:
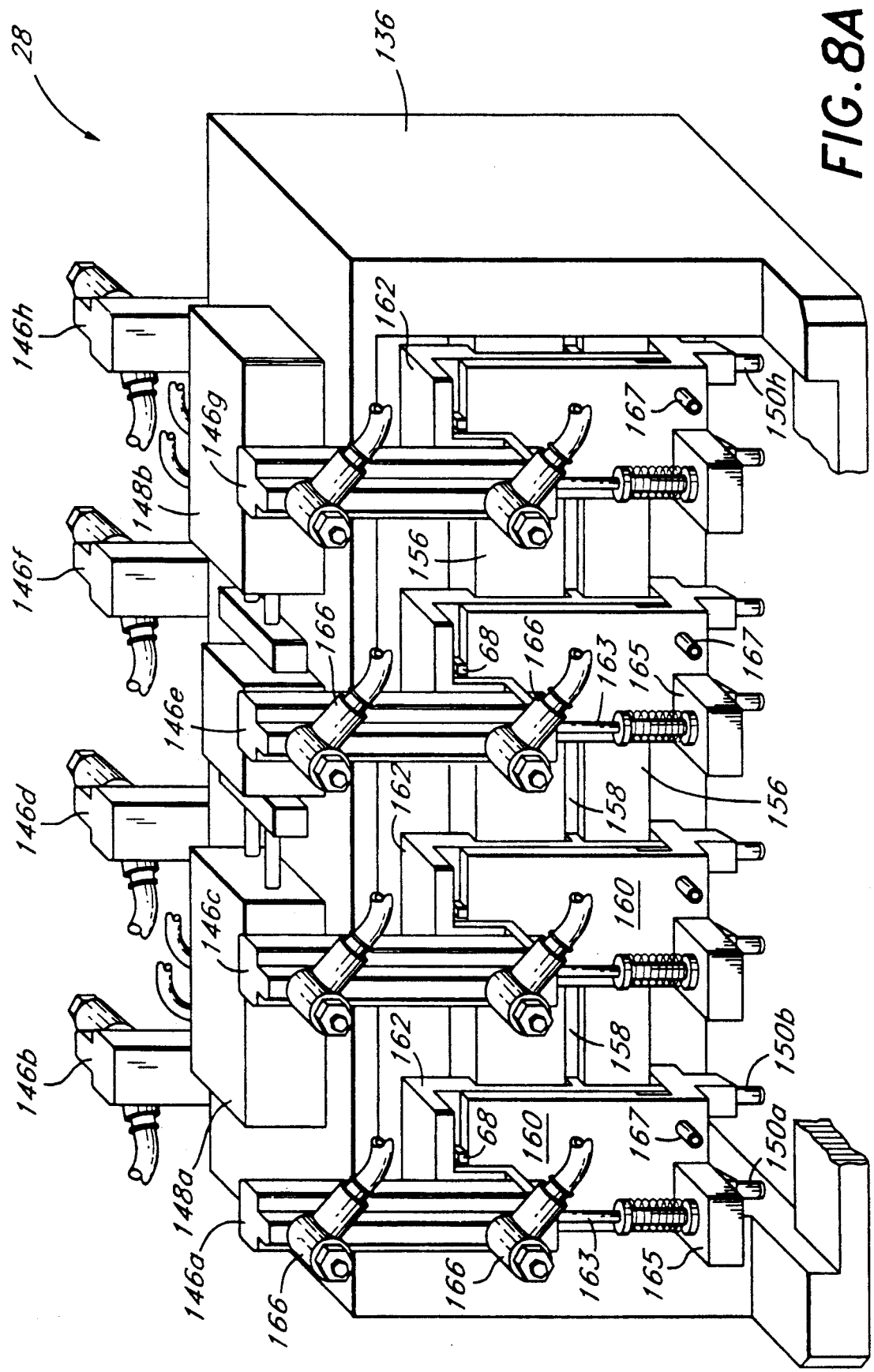
FIG. 8A is a perspective view of the pick and place of the present invention showing the detailed structure of the suction inlets, the upper supports, the lower supports, the guide and the air cylinders. The pick and place of the example includes eight units of suction inlets for picking and placing up to eight electronic devices at a time.
Figure 8B:
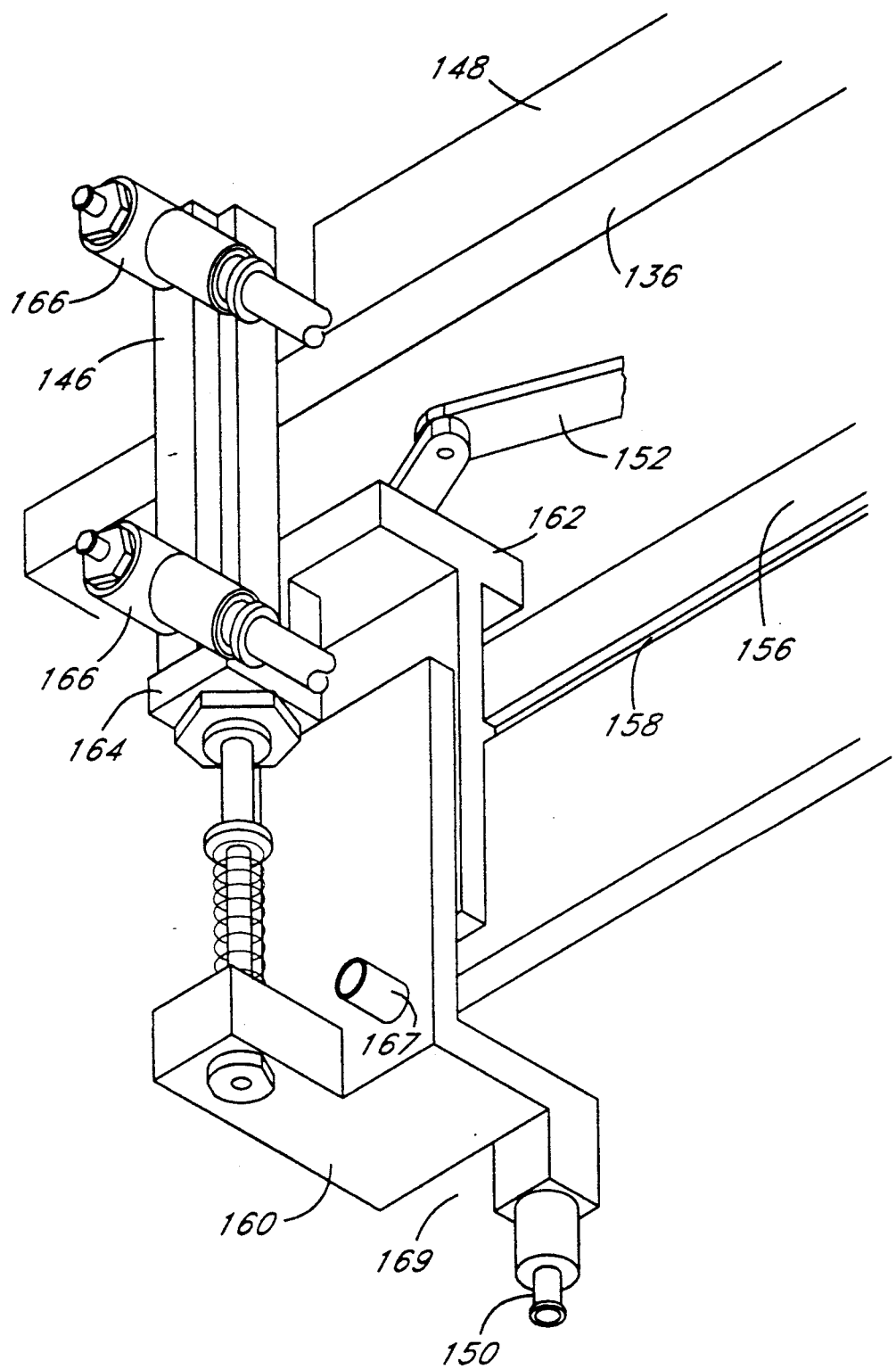
FIG. 8B is a perspective view of the pick and place of the present invention showing the structure of one unit of the pick and place of FIG. 8A.

FIG. 8A is a perspective view showing the detailed structure of the preferred embodiment of the pick and place of the present invention. FIG. 8B is a perspective view of the pick and place of the present invention for showing a more detailed structure with respect one unit of the suction inlet 150. The suction inlet 150 and an air pipe connector 167 are attached directly to the bottom of a lower support 160 and indirectly to an upper support 162. A vacuum force is provided to the suction inlet 150 through the air connector and the air pipe to cause a suction force at the end of the suction inlet 150 when picking up the IC device. The lower support 160 is slidably engaged with the upper support 162 through a guide groove 158 provided in vertical direction on the upper support 162. The air cylinder 146 is connected to the upper support 162 by a connection member 164. The air cylinder 146 includes a pair of air connectors 166 and a piston rod 163. The piston rod 163 is connected to the lower support 160 through connection member 165. The compressed air provided to one of air connectors 166 is used for giving the piston rod 163 a downward force to drive the suction inlet 150 downward, and the compressed air in the other air connector is used to impart an upward force to the suction inlet 150.

The upper support 162 engages with the guide 156 through a guide groove 158 so that the upper housing may be moved horizontally along the guide 156 by the force provided by the pantograph 152. Therefore, the suction inlet 150 can move horizontally by the movement of the upper support 162, and at the same time vertically by the movement of the air cylinder 146. To ensure a close proximity between the suction inlets 150, the lower support 160 is provided a cutout 169 (FIG. 8B) at the bottom. Although not shown in FIGS. 8A and 8B, the upper supports 162 also include similar cutouts to allow the close proximity with each other. On the housing 136, the air cylinder 148 is attached to drive the pantograph 152 by utilizing a compressed air force.

FIG. 9 is a perspective view of the pick and place of the present invention for showing the positioning for placing the electronic devices in the seat of the carrier module on the test tray. The pick and place preferably incorporates a pair of guide 175 to meet with the upper guide holes 104 of the carrier module 22. Since the carrier module is flexibly aligned on the frame of the test tray as described with reference to FIG. 6, the tapered portion on both the guide 175 and the guide hole 104 can correct the positional inaccuracy in the test tray.

Figure 10:
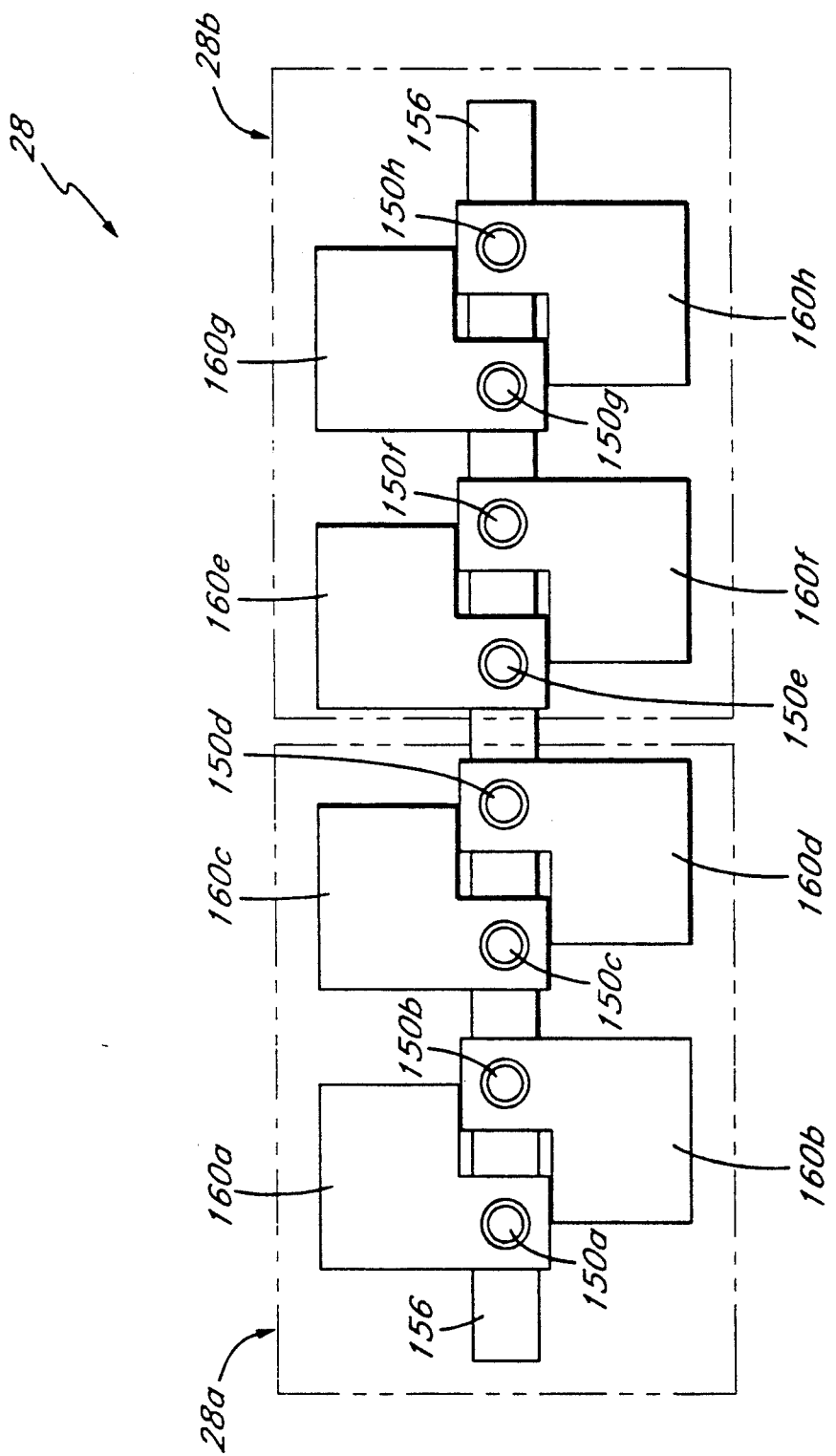
FIG. 10 is a simplified diagram regarding a bottom view of the pick and place of FIG. 8 showing a positional relationship of the suction inlets with respect to the guide.

FIG. 10 is a simplified diagram regarding a bottom view of the pick and place 28 of the present invention of FIG. 8 for showing a positional relationship of between the plurality of suction inlets with respect to the guide. In the example of FIG. 10, the pick and place 28 utilizes eight suction inlets 150a-150h for simultaneously picking and transferring eight IC devices. The suction inlets 150 are correspondingly attached to lower supports 160a-160h. As shown in the FIG. 10 and described above, the lower supports 160 have the cutout portions, the small spacing between the suction inlets 150 along the guide 156 can be achieved. In the preferred embodiment of the present invention, the pick and place 28 is formed by two pick and place members 28a and 28b (as illustrated by the dotted lines in FIG. 10) which are exactly the same as each other on the common guide 156. Namely, the pick and place 28 of the present invention has two space adjusting mechanism for the pick and place 28a and 28b, respectively. This is basically a matter of design choice and thus various forms of pick and place are possible, such as an one having four suction inlets with one space adjusting mechanism or sixteen suction inlets with two spacing adjusting mechanism and the like.

Figure 11:
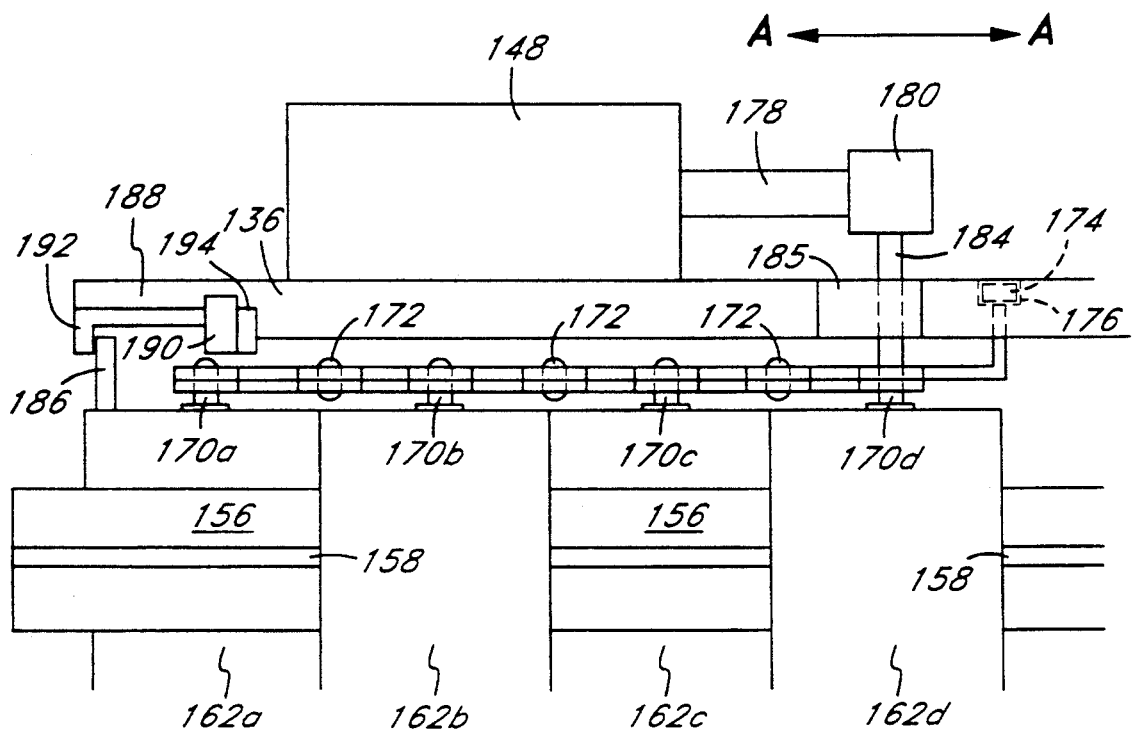
FIG. 11 is a partial front view of the pick and place of the present invention showing the relationship of the space adjusting means including the pantograph, the variable stopper and the air cylinder.
Figure 12:
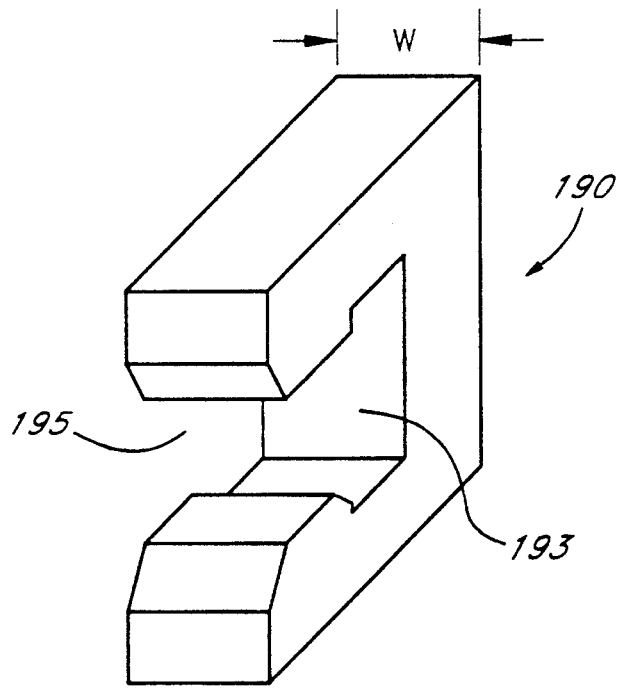
FIG. 12 is a perspective view of an example of the adjustor clip of the present invention.
Figure 13A:
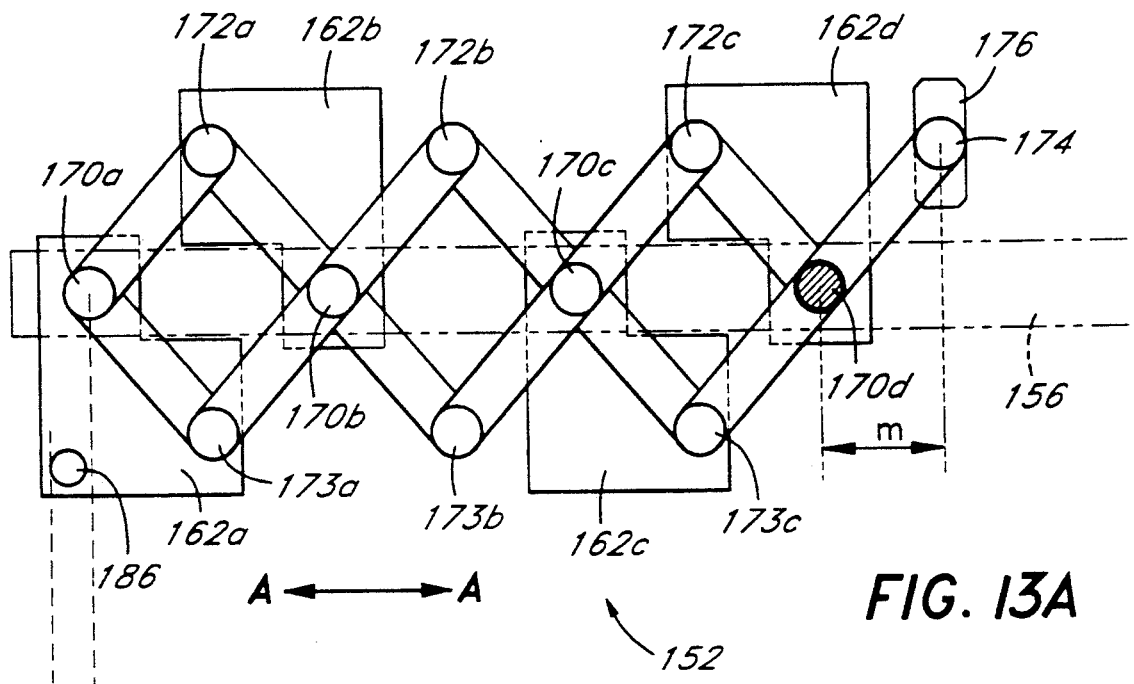
FIGS. 13A and 13B are diagrams showing a principle mechanism for adjusting the spacing of the suction inlets based on the pantograph arrangement.
Figure 13B:
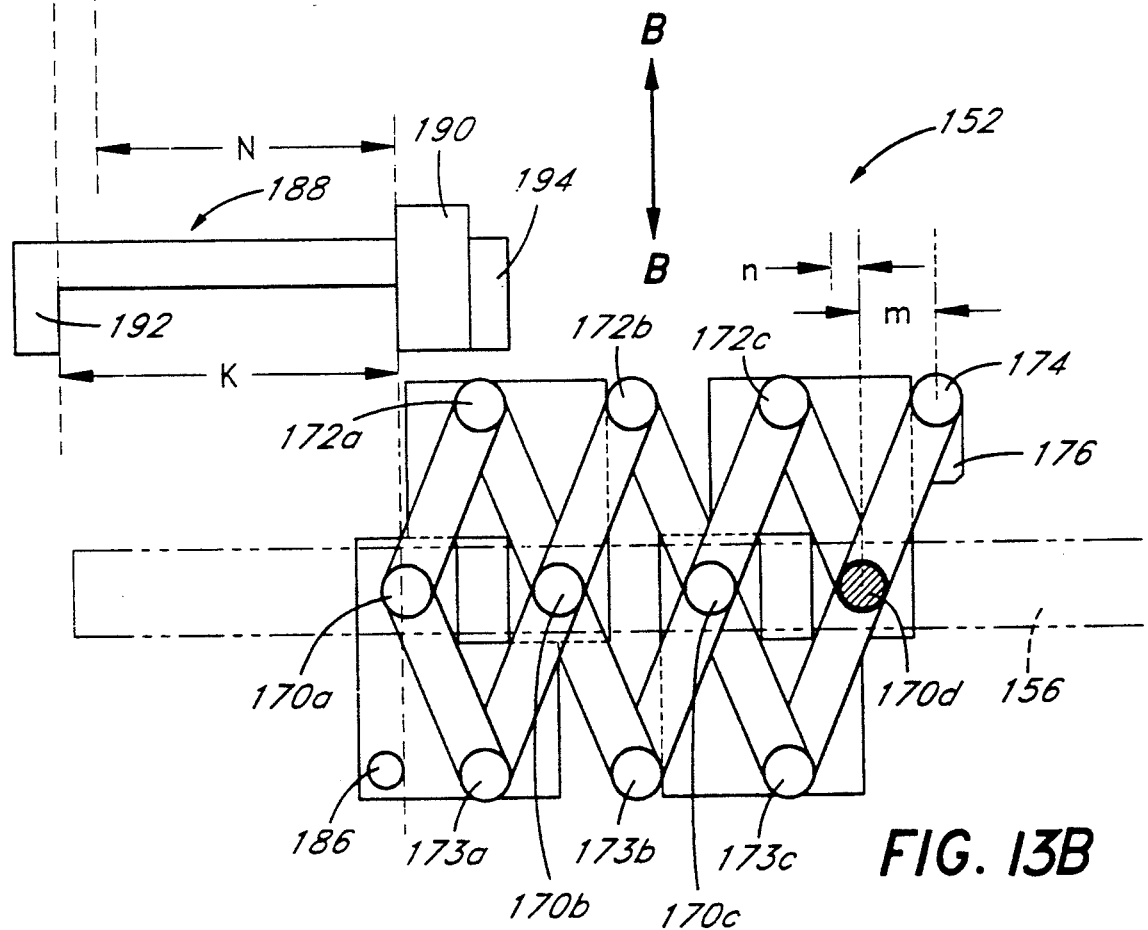

FIGS. 11, 12, 13A and 13B illustrate a structure and an operation regarding the adjustment of the spacing of the suction inlets 150 in accordance with the difference in the device spacing of the customer trays. In FIGS. 11, 13A and 13B, four suction inlets 150 (FIG. 8) constitute a pick and place 28a or 28b in accordance with the present invention. FIG. 11 is a partial front view of the pick and place showing a relationship of the space adjusting means including the pantograph, the variable stopper and the air cylinder. In FIG. 11, the upper supports 162a-162d are alternately engaged with the guide 156 as shown in FIG. 10. Although not shown, the corresponding lower supports 160 and the suction inlets 150 are attached to the upper supports 162.

The upper supports 162 are directly connected to the pantograph 152 at the connection points 170a-170d, respectively. On the other hand, the connection points 172a-172c and 173a-173c (FIG. 13A, 13B) of the pantograph 152 are free with respect to the upper supports 162 and thus are movable. An origin point 174 of the pantograph 152 is engaged with a guide hole 176 on the housing 136 wherein the origin point 174 is allowed to move only in orthogonal direction (B—B) with respect to the longitudinal direction (A—A) of guide 156 as shown in FIGS. 13A and 13B.

The connection point 170d on the upper support 162d is also connected to a driving rod 184 through a hole 185 in the housing 136. The driving rod 184 is further connected to a piston rod 178 of the air cylinder 148 through a juncture 180 on the housing 136. The air cylinder 148 is provided with the compressed air through two air connectors (not shown). One of the compressed air cylinders is used to push out the piston rod 178 and the other compressed air cylinder is used to pull in the piston rod into the air cylinder 148. Therefore, by the movement of the air cylinder 148, the connection point 170d and thus the upper support 162d is forced to move along the guide 156. This movement of the upper support 162d causes an amplified movement for the other upper supports 162 by the mechanism of the pantograph 152 which will be described in more detail later with respect to FIGS. 13A and 13B.

On the housing 136, a variable stopper 188 which has stoppers 192 and 194 on both ends is mounted. An adjustor clip 190 is preferably attached to the variable stopper 188 for providing an additional stopper position to the stopper 194. A stopper pin 186 is erected on the top of the last upper support 162a as in FIG. 11 and intrudes in the spacing between the stopper 192 and the adjustor clip 190. Thus, the variable stopper 188 defines a movable length K (FIG. 13B) of the upper support 162a.

The adjustor clip 190 is made, for example of a plastic material which is hard enough to maintain the same width for ensuring the accuracy of the stopper position but flexible to clip in the variable stopper 188. An example of the shape of the adjustor clip 190 is illustrated in FIG. 12. The adjustor clip 190 has an opening 195 which is preferably tapered for easily engaging the variable stopper 188 with a hollow 193 by pushing in thereto. Thus, the adjustor clip can easily be attachable and detachable with respect to the variable stopper 188. The width W of the adjustor clip 190 is determined by the spacing difference of the devices in the customer trays 42 to be loaded on the test handler. Therefore, depending on the kinds and spacing difference of the customer trays, the adjustor clips of different width or a plurality of adjustor clips are used.

FIGS. 13A and 13B are abbreviated diagrams showing the operation of the spacing adjustment of the pick and place 28 in accordance with the present invention. For simplicity of explanation, FIGS. 13A and 13B show only the pantograph mechanism and the top view of the upper supports 162. As described in referring to FIGS. 8 and 9, the suction inlets 150 are positioned at the bottom of the lower supports 160 exactly opposite to the fixed connection points 170. Therefore, in FIGS. 13A and 13B, the position of the fixed connection points 170a-170d also indicate the position of the suction inlets 150a-150d in FIG. 8.

FIG. 13A shows a state where the spacing between the suction inlets 150 is at a maximum so that the spacing agrees with the spacing of the seats on the test tray 24. FIG. 13B shows a state where the spacing between the suction inlets 150 is at a minimum so that the spacing agrees with the spacing of the seats on the customer tray 42. Namely, the stopper pin 186 on the upper support 162a is stopped by the stopper 192 in FIG. 13A while it is stopped by the adjustor clip 190 in FIG. 13B. As seen in the drawings, the fixed connection points 170a-170d, and thus the suction inlets 150a-150d, slide along A—A direction on the guide 156 while the connection points 172a-172c and 173a-173c move in B—B direction by the force provided at the fixed connection point 170d on the upper support 162d. The origin point 174 also moves in the B—B direction but cannot move in the A—A direction since it is restricted within the guide 176. In FIG. 13A, the connection point 170d, which is connected to the air cylinder 148, has a distance m in the A—A direction from the origin point 174 while the distance m is reduced by n in FIG. 13B. As seen in the drawings, the small movement (i.e., the distance change n in the A—A direction between the connection point 170d and the origin point 174) of the piston rod 178 can provide a big movement (i.e., a distance change N in the stopper pin 186) of the suction inlets 150 by the well known pantograph mechanism while keeping the equal spacing between the suction inlets 150. The stopper pin 186 can be erected on the other position such as on the upper support 162c. However, since the movement of the pantograph 152 at the side of the connection point 170d is amplified at the side of the connection point 170a, and the factor of amplification is at maximum at the point 170a, it is preferable to place the stopper pin 186 on the last upper support 162a in terms of accuracy of the spacing.

As has been foregoing, the pick and place of the present invention comprises a housing, a plurality of suction inlets for picking up electronic devices with a vacuum, a guide for horizontally guiding the suction inlets and a space adjusting mechanism for compensating for the spacing differences between the customer tray and the test tray. In this arrangement, the pick and place apparatus of the present invention overcomes the problems associated with gravity-fed, conventional automatic test handlers or horizontal transfer type conventional test handlers of the prior art by providing precise pick and place movement along a horizontal plane while providing for adjustment and correction of the device spacings while loading the electronic devices from one type of tray to the other type of tray.

The space adjusting means includes a variable stopper for adjusting variance of the spacing in the customer trays and a pantograph mechanism driven by an air cylinder. Since the pantograph mechanism amplifies a small movement of the air cylinder, relatively large difference in the spacing between the test tray and the customer tray can be adjusted. An adjustor clip is provided in the variable stopper means for interchangeably adjust the spacing difference between the customer trays.

Although the invention has been described in terms of the preferred embodiment, other embodiments that are apparent to those of ordinary skill in the art are also within the scope of the invention. Accordingly, the scope of the invention is intended to be defined only by reference to the appended claims.

What is claimed is:

1. A pick and place for use in an automatic test handler in connection with an electronic device test system for removing electronic devices from one tray and transferring said electronic devices in a horizontal plane and placing them in another tray, comprising:

a plurality of suction inlets for picking up said electronic devices from said one tray with a suction power and transferring them in a horizontal plane and placing said electronic devices on said other tray;

a guide frame for slidably mounting said plurality of suction inlets in a horizontal direction;

up and down means for providing up-and-down movement to said suction inlets for picking said electronic devices from said one tray and placing said devices in said other tray;

space adjusting means for adjusting a difference in device spacing between said one tray and the other tray during a picking and placing operation, said space adjusting means including:

a pantograph means which amplifies movement of a drive mechanism for providing a proportional space variation to said suction inlets;

an air cylinder for driving said pantograph mechanism by force of compressed air; and a variable stopper for adjusting said device spacing difference between said trays.

2. A pick and place for an automatic test handler as defined in claim 1, wherein said pantograph mechanism amplifies a movement given by said air cylinder to provide an increased movement to said suction inlets.

3. A pick and place for an automatic test handler as defined in claim 1, wherein said variable stopper includes a stopper for defining a spacing of said suction inlets corresponding to said one tray and a adjustor clip for defining a spacing of said suction inlets corresponding to said another tray.

4. A pick and place apparatus for use in an automatic test handler in connection with an electronic device test system for removing electronic devices from one tray and transferring said electronic devices in a horizontal plane and placing them in another tray, comprising:

a plurality of suction inlets for picking up said electronic devices from said one tray with a suction power and transferring them in a horizontal plane and placing said electronic devices on said other tray;

a guide frame for slidably mounting said plurality of suction inlets in a horizontal direction;

up and down means for providing up-and-down movement to said suction inlets for picking said electronic devices from said one tray and placing said devices in said other tray;

space adjusting means for adjusting a difference in device spacing between said one tray and the other tray during a picking and placing operation, said space adjusting means including a pantograph mechanism for providing a proportional variation of a space between said suction inlets, an air cylinder for driving said pantograph mechanism by force of compressed air, and a variable stopper for adjusting said device spacing difference between said trays.

5. A pick and place for an automatic test handler as defined in claim 4, wherein said pantograph mechanism amplifies a movement given by said air cylinder to provide an increased movement to said suction inlets.

6. A pick and place for an automatic test handler as defined in claim 4, wherein said variable stopper includes a stopper for defining a spacing of said suction inlets corresponding to said one tray and a adjustor clip for defining a spacing of said suction inlets corresponding to said another tray.

* * * * *